United States Patent
Izumi et al.

(10) Patent No.: US 7,512,917 B2
(45) Date of Patent: Mar. 31, 2009

(54) METHOD FOR VERIFYING SAFETY APPARATUS AND SAFETY APPARATUS VERIFIED BY THE SAME

(75) Inventors: Mikio Izumi, Yokohama (JP); Toshifumi Hayashi, Yokohama (JP); Shigeru Odanaka, Yokohama (JP); Hirotaka Sakai, Machida (JP); Naotaka Oda, Yokohama (JP); Toshifumi Sato, Tama (JP); Toshiaki Ito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 422 days.

(21) Appl. No.: 11/360,617

(22) Filed: Feb. 24, 2006

(65) Prior Publication Data

US 2009/0055784 A1  Feb. 26, 2009

(30) Foreign Application Priority Data

Feb. 28, 2005  (JP)  ............................. 2005-053016

(51) Int. Cl.
*G06F 17/50* (2006.01)
(52) U.S. Cl. ................... 716/5; 716/4; 716/16; 716/17; 716/18
(58) Field of Classification Search ................. 716/4–5, 716/16–18; 714/25, 41, 48, 724–725
See application file for complete search history.

(56) References Cited

U.S. PATENT DOCUMENTS 7,343,579 B2 * 3/2008 Coxe et al. .................... 716/16

FOREIGN PATENT DOCUMENTS

| JP | 2653522 | 5/1997 |
|---|---|---|
| JP | 2003-287587 | 10/2003 |
| JP | 2004-317183 | 11/2004 |
| JP | 2004-318254 | 11/2004 |

* cited by examiner

*Primary Examiner*—Paul Dinh
(74) *Attorney, Agent, or Firm*—Oblon, Spivak, McClelland, Maier & Neustadt, P.C.

(57) ABSTRACT

A verification method is provided for verifying a safety apparatus including a programmable logic device having a plurality of functional elements. The verification method includes the steps of exhaustively verifying the plurality of functional elements on actual hardware, generating a functional element that is the same as one of the functional elements verified on the actual apparatus using a predetermined hardware description language, independently logic-synthesizing each generated functional element into a plurality of first net lists, generating a connection function between the functional elements using the predetermined hardware description language, logic-synthesizing the generated connection function into a second net list corresponding to the connection function, synthesizing the first net lists with the second net list to generate a third net list, writing a logic circuit into the programmable logic device on the basis of the third net list, and verifying the actual programmable logic device.

24 Claims, 11 Drawing Sheets

METHOD FOR VERIFYING SAFETY APPARATUS AND SAFETY APPARATUS VERIFIED BY THE SAME

BACKGROUND OF THE INVENTION

1. Field of the Invention

The present invention relates to a method for verifying a safety apparatus and a safety apparatus verified by the method and, in particular, to a method for verifying a safety apparatus that is used to control a nuclear power plant, a thermal power plant, a chemical plant or the like and that is required to ensure high reliability and the safety apparatus verified by the method.

2. Description of the Related Art

A nuclear power plant includes a-safety apparatus to prevent the occurrence of an abnormal event or reduce the possibility of the occurrence of an abnormal event that might endanger the safety of the plant when the abnormal event is anticipated or the abnormal event occurs.

A radiation counting apparatus (safety apparatus) associated with a safety protection system is provided to count the amount of radiation. If the amount of radiation increases in a plant due to some reason, the radiation counting apparatus delivers, to operating circuits, information indicating a condition to shut down the area where the amount of radiation is increasing or a condition to activate an emergency gas processing apparatus.

In recent nuclear power plants, such a radiation counting apparatus (safety apparatus) associated with safety protection system carries out a digital signal process in which one central processing unit (CPU) executes digital filtering or digital calculation of a plurality of signals (refer to, for example, Japanese Patent No. 2653522).

In contrast, U.S. Pat. No. 5,859,884 discloses a system using a hardware logic circuit known as an application specific integrated circuit (ASIC) or a field-programmable gate array (FPGA) in place of a CPU. In the technology described in U.S. Pat. No. 5,859,884, a circuit is configured using an ASIC in place of a CPU to control the procedure of the process. This technology simplifies the process flow.

Since the safety apparatus is important, failure of one unit must not result in loss of the total control of the apparatus. Accordingly, a multiplex configuration that provides redundancy of the system is employed or each component of the apparatus is configured to be independent.

However, in a digital system in which a CPU executes software, if the same software is used for the redundant system and the main system, there is a possibility that a defect of the software impairs the functionality of the redundant system.

In addition, since digital processing including the software processing is basically discrete-value processing, there is a higher possibility that an unexpected operation could be executed due to software and hardware defects than for an analog device. For example, in digital processing, an abnormal output might occur when some specific condition is satisfied.

Accordingly, in digital processing using software, a quality assurance activity is required to be carried out to assure the high quality of the digital processing through the design phase to manufacturing phase. Also, an appropriate protection is required against a common malfunction factor caused by a software defect or an uncontrolled design change.

In particular, to protect against a common malfunction factor caused by a software defect, "verification & validation" activities (hereinafter referred to as "V & V") are practiced. "V & V" are quality assurance activities that include the following two processes: a verification process to verify that the functional requirement for a digital safety apparatus is correctly realized from a higher level step to a lower level step through the software design process to manufacturing process; and a soundness determination process to determine that the requirement is correctly realized in the system manufactured through the verification process.

In contrast, in a system using an ASIC or an FPGA in place of a CPU, a hard-wired digital logic circuit is provided. Unlike the software process performed by a CPU, this process has a fixed process flow. Also, processing time can be determined by the design. Accordingly, the system using an ASIC or an FPGA can be regarded as semiconductor hardware of the digital logic circuit.

As a result, although the FPGA or the like uses some software in the manufacturing process, the FPGA can be verified assuming that the process carried out is the same as the process of the hardware actually installed. For example, by comparing the outputs of a semiconductor device corresponding to all the inputs and all the internal states with the estimated values computed from its specification, the input and output properties of the static function can be completely verified except for the dynamic defects caused by a timing issue. Such a verification method is referred to as "exhaustive testing".

However, in an actual ASIC or FPGA, the sum of the number of all the input bit patterns and the number of all the internal state patterns of the device is huge. Accordingly, in general, it is recognized that it is impractical to compare output patterns corresponding to all the input and internal state patterns with the estimated values.

Therefore, evaluation of an input pattern string capable of efficiently detecting a defect is critical. For example, by evaluating the logic patterns inside the device, an input pattern group that causes internal registers to activate at least one time is computed or an input pattern group that can detect specific fault pattern modes is computed by fault simulation.

However, since only some of the patterns are verified in the above-described technique, this technique cannot detect a defect caused by a combination of the internal logics and a defect that is not taken into account in the fault simulation.

Furthermore, to implement a logic circuit (digital circuit) in hardware, such as an FPGA, a utility software tool is needed, which includes software for creating the hardware configuration description and a logic synthesis tool for converting the hardware configuration description to an actual logic circuit on the FPGA. However, this utility software tool itself might have a defect if, in particular, this utility software tool is newly developed. Accordingly, total reliability starting from the design phase must be assured including the reliability of the utility software tool.

If the above-described exhaustive testing can be carried out in the performance verification, the static logic error can be found. However, if the above-described exhaustive testing cannot be carried out, the V & V verification is needed as for the known software.

However, unlike the software process performed by a CPU, the process of the system using an FPGA is fixed, and therefore, in general, the process time can be determined. Additionally, a single loop can execute only a single process. Therefore, design conditions for realizing a highly reliable system can be easily satisfied.

As described above, implementing a safety apparatus using a hardware logic circuit, such as an FPGA, provides a strong advantage from the viewpoint of verification. However, functional verification must be efficiently carried out virtually at the same level as the above-described exhaustive testing. That is, it is required that a verification method be developed that can reliably and quickly verify whether the output property of the safety apparatus with respect to an input is the same as that defined by the design.

In addition to the static error, a dynamic error may occur that is caused by a timing issue between internal operations. For example, if the delay time between internal logics varies due to the environmental condition (e.g., temperature) or the power supply condition, there is a possibility that the apparatus erroneously operates due to the atmospheric conditions. To prevent an error caused by a timing issue, a sufficient margin should be provided in the design phase using timing simulation. Furthermore, a verification method is required that can highly reliably carry out verification as needed in an actual environment which is anticipated to appear.

While the foregoing problems have been described with reference to a nuclear power plant, it is also important, in a field that requires a highly reliable control system, such as an oil plant or a chemical plant, to develop a design system that can assure the reliability of a similar digital apparatus in the design and manufacturing phases and, in particular, a design system that can detect a hidden defect.

SUMMARY OF THE INVENTION

Accordingly, it is an object of the present invention to provide a verification method that can highly efficiently and reliably test and verify a component of a safety apparatus in, for example, a nuclear power plant and a safety apparatus verified by the verification method.

According to an embodiment of the present invention, a verification method for verifying a safety apparatus including a programmable logic device is provided. The programmable logic device includes a plurality of functional elements. The method includes the steps of exhaustively verifying on actual hardware that all the outputs of the logic pattern are produced normally in response to all the inputs of the logic pattern of each functional element in advance, generating a functional element that is the same as one of the functional elements verified on actual hardware using a predetermined hardware description language, independently logic-synthesizing each generated functional element into a plurality of first net lists, each of which corresponding to one of the functional elements, generating a connection function between the functional elements using the predetermined hardware description language, logic-synthesizing the generated connection function into a second net list corresponding to the connection function, synthesizing the plurality of first net lists with the second net list to generate a third net list, writing a logic circuit into the programmable logic device on the basis of the third net list, and verifying on the actual programmable logic device including the written logic circuit that the operation of the programmable logic device is normal.

According to another embodiment of the present invention, a safety apparatus includes a programmable logic device including a plurality of functional elements. The safety apparatus is verified by a verification method including the steps of exhaustively verifying on actual hardware that all the outputs of the logic pattern are produced normally in response to all the inputs of the logic pattern of each functional element in advance, generating a functional element that is the same as one of the functional elements verified on actual hardware using a predetermined hardware description language, independently logic-synthesizing each generated functional element into a plurality of first net lists, each of which corresponding to one of the functional elements, generating a connection function between the functional elements using the predetermined hardware description language, logic-synthesizing the generated connection function into a second net list corresponding to the connection function, synthesizing the plurality of first net lists with the second net list to generate a third net list, writing a logic circuit into the programmable logic device on the basis of the third net list, and verifying on the actual programmable logic device including the written logic circuit that the operation of the programmable logic device is normal.

According to a method for verifying a safety apparatus and a safety apparatus verified by the method of the present invention, components of a safety apparatus (e.g., nuclear power plant) can be highly efficiently and reliably tested and verified.

DESCRIPTION OF THE PREFERRED EMBODIMENTS

A verification method of a safety apparatus according to an embodiment of the present invention and a safety apparatus verified by the verification method are now herein described with reference to the accompanying drawings.

(1) Positioning of Safety Apparatus and System Architecture

Figure 1:
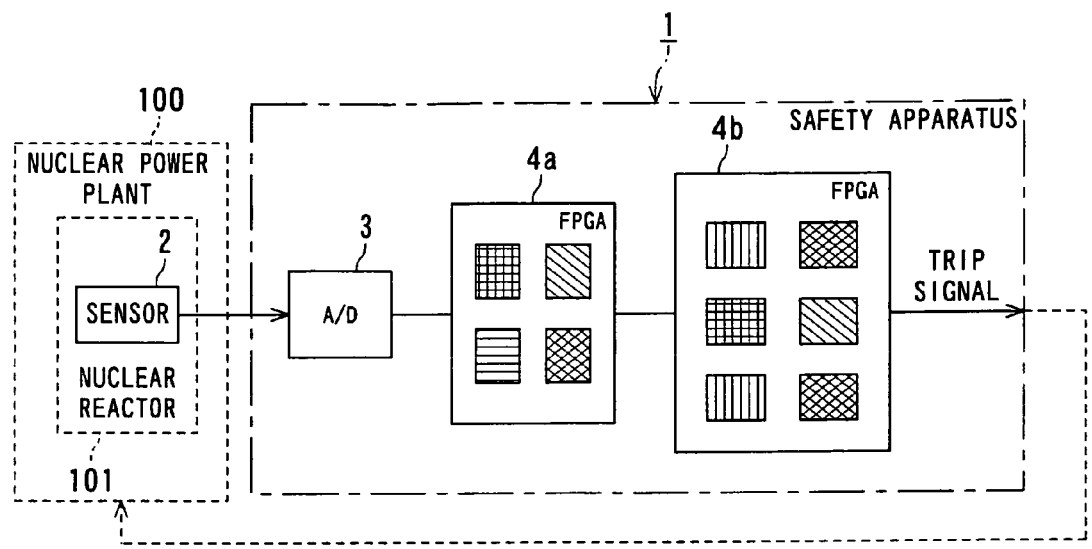
FIG. 1 illustrates a constitutive model of a safety apparatus according to an embodiment of the present invention.

FIG. 1 illustrates an exemplary basic configuration of a safety apparatus 1 according to an embodiment of the present invention. FIG. 1 also illustrates an exemplary external apparatus connected to the safety apparatus 1.

Examples of the safety apparatus 1 include an apparatus that monitors the internal state of a nuclear reactor 101 installed in a nuclear power plant 100 and, if an abnormal event occurs or an abnormal event is anticipated to occur, outputs a signal (i.e., trip signal) to start a safety protection operation that stops the nuclear reactor 101 or that separates the abnormal section from the nuclear reactor 101.

An input terminal of the safety apparatus 1 receives the output of a sensor 2. Examples of the sensor 2 include a radiation sensor installed inside the nuclear reactor 101.

An output terminal of the safety apparatus 1 outputs a trip signal. This trip signal is output from the safety apparatus 1 when it checks the safety of the nuclear reactor 101 on the basis of the output of the sensor 2 and when the abnormal event of the nuclear reactor 101 occurs or the abnormal event is anticipated to occur. By feeding back the trip signal to the nuclear power plant 100, the nuclear power plant 100, for example, stops the nuclear reactor 101 or shuts down the abnormal section to ensure the safety.

The safety apparatus 1 includes an analog to digital (A/D) converter 3 which converts a signal input from the sensor 2 to a digital value after reshaping the waveform of the input signal. The output of the A/D converter 3 is input to an FPGA 4a.

The term "FPGA" refers to a programmable large-scale integrated circuit. By externally writing data into a general-purpose FPGA provided by a FPGA maker (i.e., FPGA in which data has not been written yet), a user can achieve a variety of functions in accordance with the specification defined by the user.

An FPGA is one type of programmable logic devices (PLDs). A highly integrated PLD is referred to as an FPGA, which has been widely used in the recent years.

An unnecessary signal is removed from the output of the sensor 2 converted into a digital value by a function written into the FPGA 4a (e.g., a digital filter function). Subsequently, the digital value is output to an FPGA 4b, which is a subsequent stage of the FPGA 4a. The FPGA 4b provides, for example, a function to compare an appropriate setting value with the output of the sensor 2 so as to determine the occurrence of an abnormal event. If it is determined that an abnormal event occurs, the FPGA 4b outputs a trip signal.

FIG. 1 indicates only positioning of the safety apparatus 1 according to an embodiment of the present invention in a field of industrial applicability and indicates that a main component of the safety apparatus 1 includes a programmable logic device, such as an FPGA, but not the particular configuration of the safety apparatus 1.

Accordingly, the types and the number of sensors that input signals to the safety apparatus 1 may be plural. Also, the types and the number of FPGAs and the installation method of the FPGAs are not limited to those shown in FIG. 1.

To assure the high reliability required for the safety apparatus 1, it is very important to verify the reliability of each programmable logic device of the safety apparatus 1.

Therefore, a method for verifying a programmable logic device is now herein described. Although examples of programmable logic devices also include an ASIC, a gate array, and a PLD, the method is described with reference to an FPGA.

As used herein, the method for verifying a safety apparatus refers to a method for verifying each programmable logic device.

(2) Procedure of Method for Verifying FPGA

Figure 2:
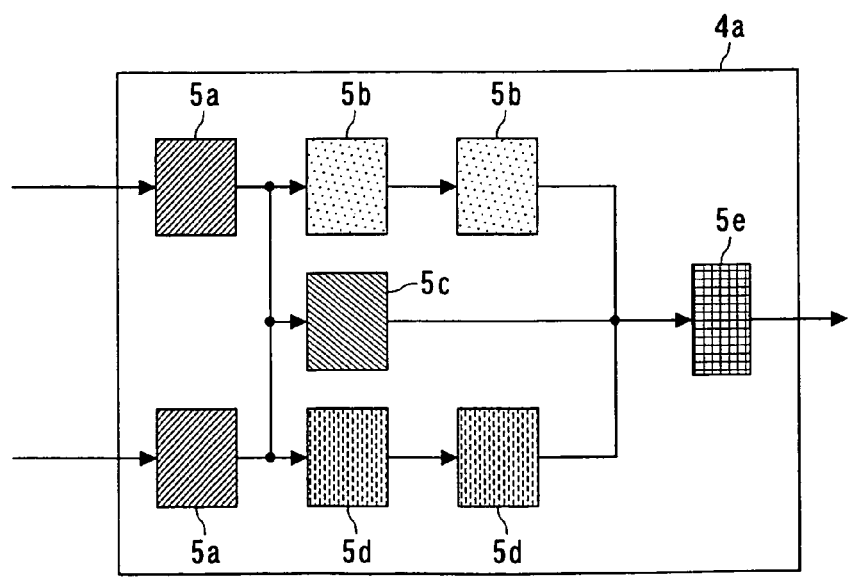
FIG. 2 illustrates a constitutive model of a programmable logic device included in a safety apparatus according to an embodiment of the present invention.

FIG. 2 illustrates an exemplary internal configuration of the FPGA 4a, which is one type of FPGAs shown in FIG. 1. While the following description is specifically directed to the FPGA 4a, the method for verifying an FPGA can be applied to an FPGA providing any type of functions.

Recently, some of the FPGAs 4a have included as many as a few million gates. Although the FPGA 4a may be regarded as a highly integrated large-scale integrated circuit (LSI), the internal structure includes a plurality of functionally divided elements.

These functionally divided elements are hereinafter referred to as "functional elements". The FPGA 4a shown in FIG. 2 includes five types of functional elements 5a, 5b, 5c, 5d, and 5e.

Each of the functional elements 5a to 5e includes logic circuits, such as an AND circuit, an OR circuit, a flip-flop circuit, an adder circuit, and a counter circuit. The combination of these logic circuits provides a predetermined function of each of the functional elements 5a to 5e.

By connecting the functional elements 5a to 5e to each other using a connection line, the function of the entire FPGA 4a is provided.

In general, an FPGA is manufactured in the following steps.

In a first step, a function realized by the FPGA is defined as a specification.

In a second step, the function defined by the specification is written in a program language called a hardware description language. The hardware description is written in the hardware description language using an appropriate text editor. The generated functional data is stored in a computer. Examples of the hardware description language include VHDL language, System-C, Verilog language and others. While this embodiment is described with reference to the VHDL language, another language may be employed.

In a third step, the functional data written in the hardware description language is converted to logic data called a net list using general-purpose software called a logic synthesis tool. This conversion process is referred to as "logic synthesis". The net list includes data associated with the configuration of a logic circuit. The data represents elements of the logic circuit (e.g., an AND circuit, an OR circuit, a flip-flop circuit, an adder circuit, and a counter circuit) and the connections among the elements.

Additionally, the net list includes not only data associated with a relationship of connection among the elements of the logic circuit but also data associated with the physical positions of the elements.

The logic circuit that realizes the function written in the hardware language in the second step is not necessarily one. A plurality of logic circuits can provide the same function. For example, the logic circuit can be optimized in terms of the fastest processing speed or in terms of the minimum scale of the logic circuit (i.e., the minimum number of the devices of the logic circuit). Accordingly, in general, a logic synthesis tool allows a user to select, as an option, the execution of optimization and the type of the optimization.

In a fourth step, simulation of the operation is carried out on the basis of the logic data in the net list so as to determine whether the logic circuit operates normally. However, this simulation step may be eliminated depending on the scale of the logic circuit.

In a fifth step, data is written into the FPGA on the basis of the net list data. Thus, the FPGA that can actually operate is achieved. Thereafter, test and verification of the actual FPGA are carried out.

In the foregoing description, basic steps for manufacturing a widely used FPGA are illustrated. However, for the method for verifying the safety apparatus 1 according to this embodiment of the present invention, extremely high reliability is required. Therefore, the flow of steps is provided while focusing on assurance of the reliability.

Figure 3:
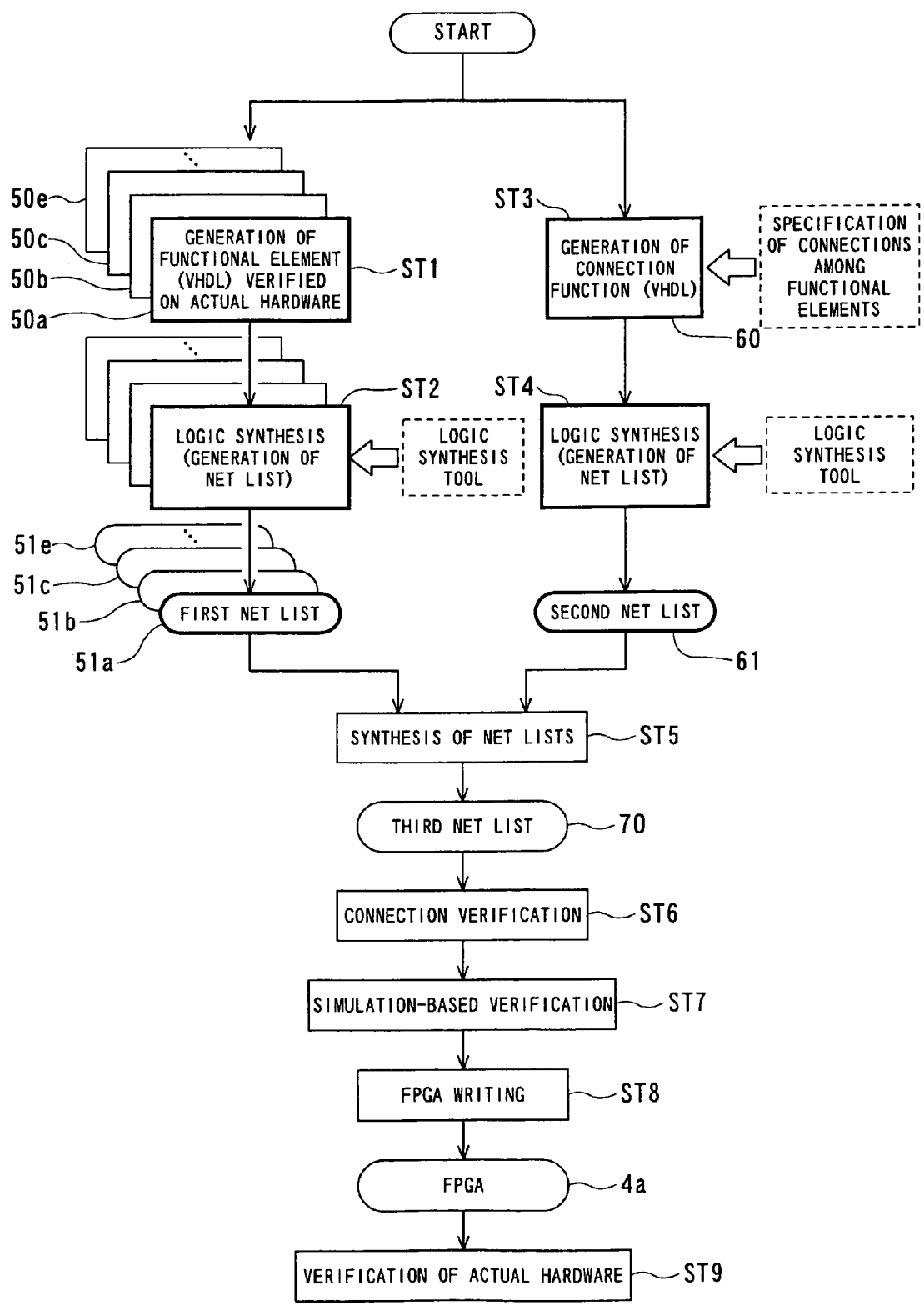
FIG. 3 illustrates the procedure of a method for verifying the safety apparatus according to an embodiment of the present invention.

FIG. 3 illustrates an embodiment of the procedure of a method for verifying an FPGA included in the safety apparatus 1 according to the present invention.

Figure 4:
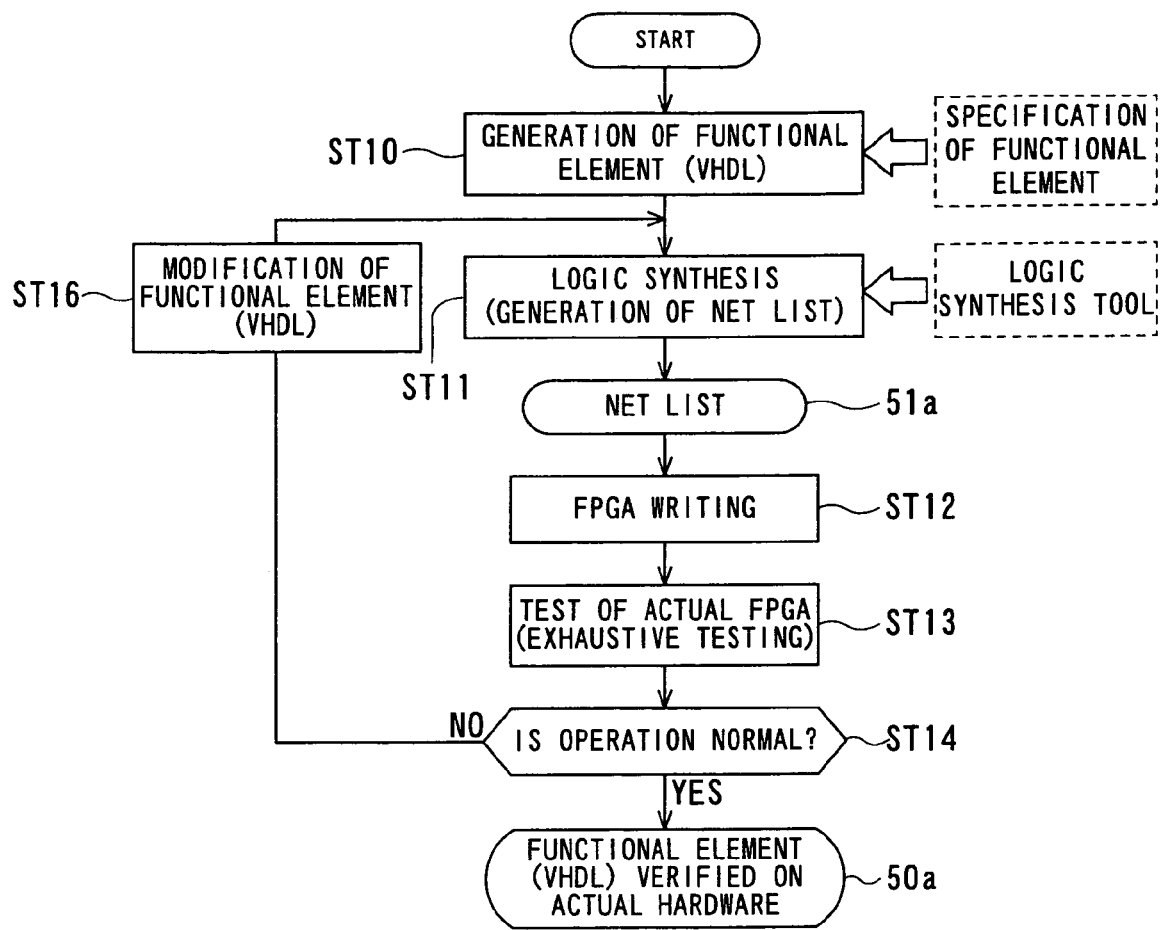
FIG. 4 illustrates an exemplary procedure of verifying a functional element of the actual programmable logic device.

In step ST1, data corresponding to each of the functional elements 5a to 5e are generated using the VHDL language (hereinafter referred to as a "functional element (VHDL)". The functional elements (VHDL) 50a to 50e are generated without any modification after the functional elements (VHDL) 50a to 50e have been sufficiently tested in an actual FPGA in advance. FIG. 4 illustrates the detailed procedure of step ST1.

That is, FIG. 4 illustrates a process of generating one functional element (VHDL) (i.e., the functional element (VHDL) 50a).

First, at step ST10, the functional element (VHDL) 50a is generated by writing code in the VHDL language on the basis of the specification of the functional element 5a.

Subsequently, at step ST11, logic synthesis is carried out using a general-purpose logic synthesis tool so as to generate a net list 51a corresponding to the functional element (VHDL) 50a. At that time, by selecting an optimization option that reduces the circuit scale to minimum from among the options provided by the logic synthesis tool, logic circuit data for the minimum circuit scale that realizes the functional element 5a can be generated.

Thereafter, at step ST12, the data of the net list 51a is written into an FPGA (actual FPGA for testing). A simulation step to verify the operation based on the data of the net list 51a may be added as needed before writing the data into the FPGA.

At step Stl3, exhaustive testing is carried out on the FPGA (actual FPGA for testing). The exhaustive testing refers to a method for testing to ensure a normal operation by comparing outputs for all the inputs and all the internal states with the estimated values computed from the specification.

In general, for a large-scale digital circuit, such as an entire FPGA, exhaustive testing is virtually impossible since the number of input patterns and the number of internal state patterns increase at an exponential rate.

However, for the functional element 5a, which is a finely divided element of the FPGA, exhaustive testing is possible. Additionally, since exhaustive testing verifies all the bit patterns, an abnormal operation that occurs only when a highly specific discrete value is input can be verified in advance. Therefore, exhaustive testing is the most effective method for verifying an FPGA in terms of reliability.

If a normal operation is ensured from the exhaustive testing using the actual FPGA for testing (Yes at step ST14), high data reliability of the functional element (VHDL) 50a is guaranteed (step ST15).

In contrast, if an abnormal event is found in the exhaustive testing, the cause is investigated. Subsequently, the functional element (VHDL) 50a is modified (step ST16). The process then returns to step ST11.

Additionally, the similar exhaustive testing is carried out for each of other functional elements (VHDL) 50b to 50e.

Thus, at step ST1 shown in FIG. 3, the functional elements (VHDL) 50a to 50e verified using the actual FPGA are generated.

At step ST2, logic synthesis is independently carried out for each functional element (VHDL) using the logic synthesis tool so as to generate the net lists 51a to 51e respectively corresponding to the functional elements (VHDL) 50a to 50e (i.e., first net lists). Since this procedure has been verified in the flow shown in FIG. 4, there is little possibility of a new defect factor being mixed into this procedure. Additionally, the effectiveness of the logic synthesis tool has also been verified in the flow shown in FIG. 4.

To configure an entire FPGA, the functional elements (VHDL) 50a to 50e are connected to each other. The data required for this connection are generated at steps ST3 and ST4.

At step ST3, a connection function is described in the VHDL language on the basis of a specification that defines the connections between the functional elements 5a to 5e. A "connection function (VHDL)" is generated in the same manner as the functional element (VHDL) 50a or the like.

At step ST4, logic synthesis is carried out for the connection function (VHDL) using the logic synthesis tool so as to generate a net list (second net list) 61 that defines only connections between the functional elements.

At step ST5, the net lists (first net lists) 51a to 51e respectively corresponding to the functional elements 5a to 5e are synthesized with the net list (second net list) 61 that indicates the relationship of connection between the functional elements 5a to 5e so as to generate a third net list 70. The third net list 70 serves as data representing the connection state of the entire FPGA 4a.

At step ST6, the connection state of the logic circuits is verified on the basis of the data of the third net list 70. To verify the connection state, the connection diagram is output using the third net list 70 and human verification, such as checking with eyes, is primarily carried out.

At that time, according to the procedure shown in FIG. 3, since the net lists 51a to 51e corresponding to the functional elements that are most complicated have already been verified at step ST1, the need for verification of the net lists 51a to 51e is basically eliminated. Here, only verification for the connections between the functional elements is required to be focused on. As a result, the time required for the verification of the connection is significantly reduced, thereby allowing efficient verification of the connection.

(3) Comparison with Another Embodiment

Figure 5:
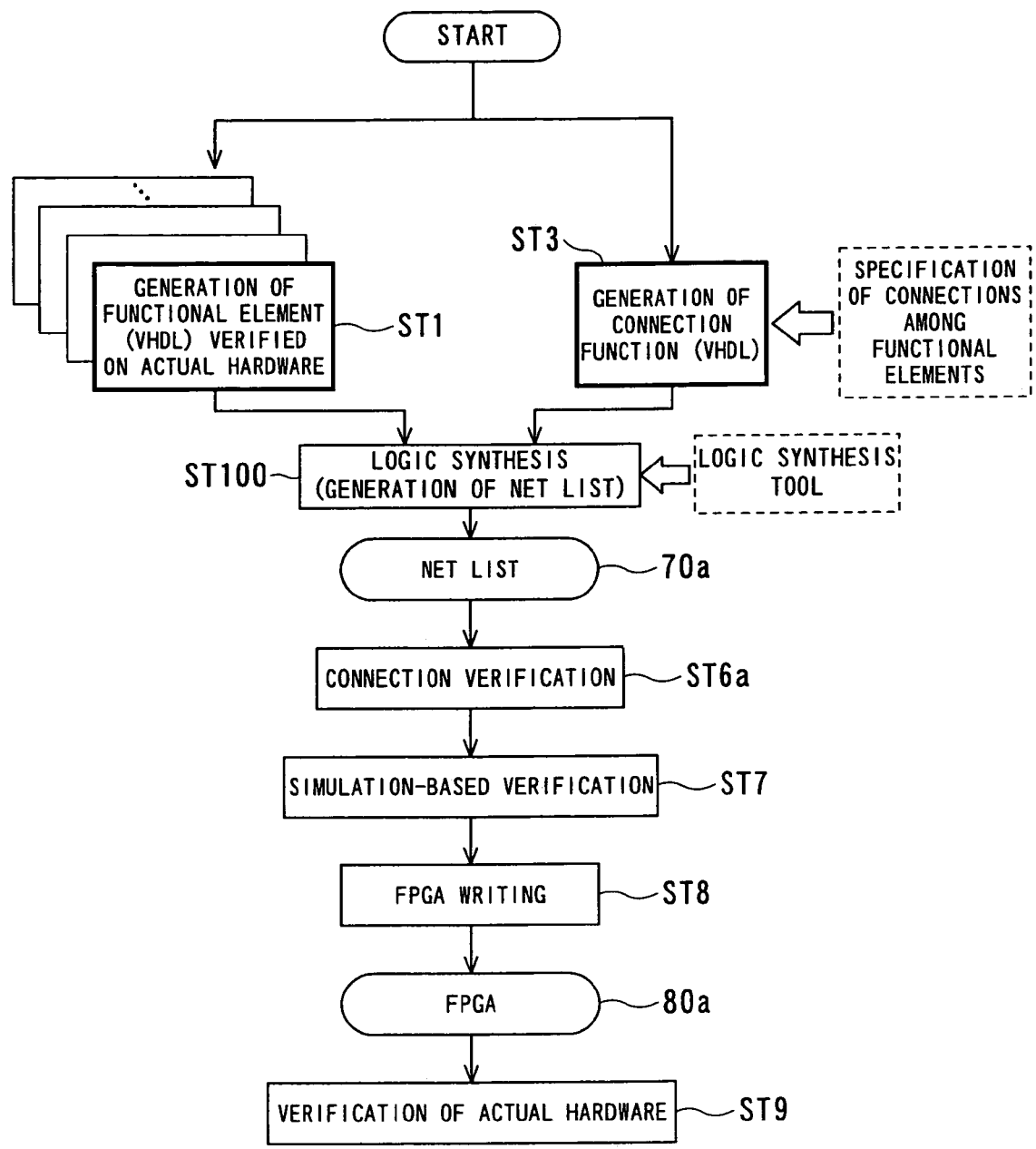
FIG. 5 illustrates a comparative example of a method for verifying a safety apparatus according to an embodiment of the present invention.

FIG. 5 illustrates another embodiment of a method for manufacturing and verifying the same FPGA 4a in comparison with the embodiment shown by the flow diagram of FIG. 3. In a procedure shown in FIG. 5, steps ST2 and ST3 are eliminated as compared with the procedure shown in FIG. 3. The procedure shown in FIG. 5 is seemingly more efficient than the procedure shown in FIG. 3. However, it is not always true. The reason is described as follows.

In both procedures shown in FIGS. 5 and 3, verification is carried out on the actual FPGA at step ST1.

In the procedure shown in FIG. 3, the net lists are synthesized after the net list is independently generated for each functional element (VHDL). Accordingly, it is ensured that the net list is the same as the one that has been verified on the actual FPGA at step ST1.

In contrast, in the procedure shown in FIG. 5, each functional element (VHDL) is logic-synthesized with the connection function at a time at step ST100. Accordingly, it is not always ensured that the net list is the same as the one that has been verified on the actual FPGA at step ST1, although the verification is completed.

If, in the procedure of logic synthesis at step ST100, the optimization, such as minimization of the circuit scale, is not specified as an option of the logic synthesis tool, the net list is very similar to the one that has been verified at step ST1. However, it is not completely ensured that the two are the same. Thus, in the verification of connection at step ST6a, the verification of connection is required for part of the inside of each functional element. As a result, the verification of connection is excessively time consuming.

In addition, since the optimization is restricted in the logic synthesis at step ST100, the scale of the circuit disadvantageously becomes large.

In contrast, according to the embodiment of a verification method shown FIG. 3, the net list generated at step ST2 (i.e., the first net list) is the same as the one that has been verified on the actual FPGA at step ST1. Therefore, the verification of connection for part of the inside of each functional element is not required at step ST6. Only the verification of the connections between the functional elements is sufficient. As a result, the time required for the verification of connection is reduced, and therefore, the verification of connection can be efficiently carried out.

Furthermore, if a logic synthesis option to minimize the circuit scale is set in the logic synthesis procedure for an actual FPGA for testing at step ST1, the net lists 51a to 51e can be generated in the same setting. Consequently, the scale of the circuit can be minimized while keeping the equivalence with the net lists verified on the actual FPGA at step ST1.

(4) Connection Verification

In the connection verification at step ST6, connections between the functional elements 5a to 5e are verified. According to this embodiment, the following two verifications of connection are carried out.

Figure 6:
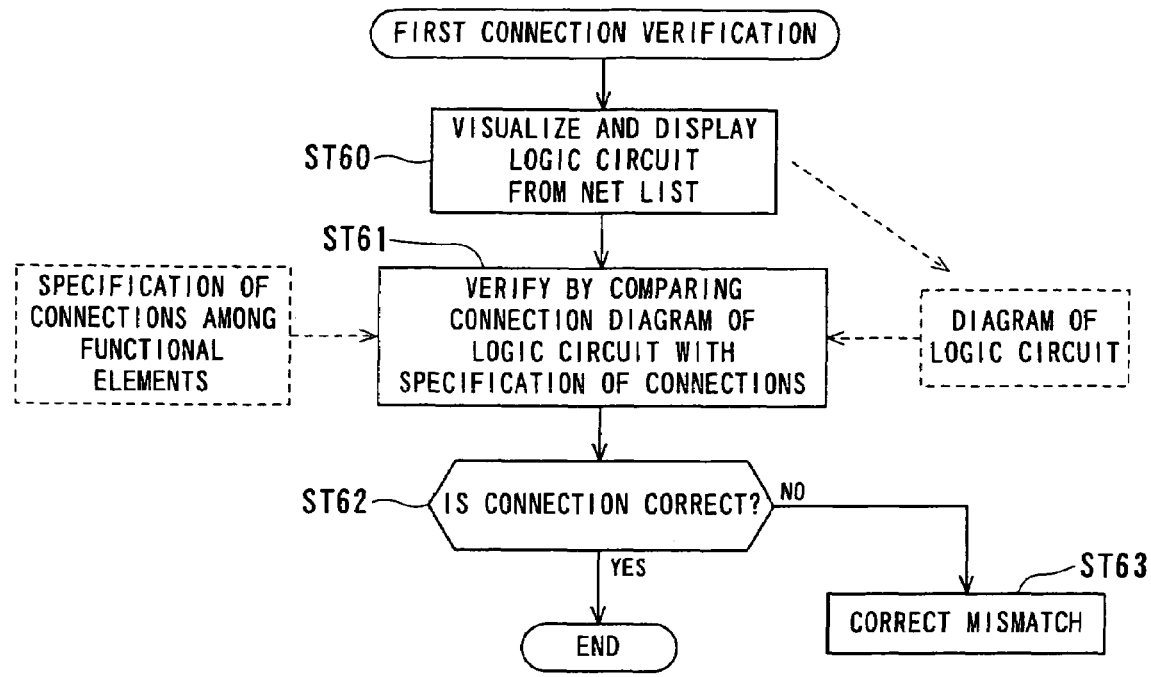
FIG. 6 illustrates an exemplary procedure of first connection verification in a verification method of a safety apparatus according to an embodiment of the present invention.

FIG. 6 illustrates the procedure of first connection verification.

At step ST60, a logic circuit diagram corresponding to data of the net list 70 (i.e., the third net list) is visualized and displayed. As a result, for example, a logic circuit diagram shown in FIG. 2 is displayed or printed out.

At that time, the logic circuits inside the functional elements 5a to 5e may be separated from the connection portions between the functional elements 5a to 5e by color in order to increase the visibility of the circuit diagram.

At step ST61, the visualized logic circuit is compared with the specification that defines the connection among the functional elements.

If the validity of the connection between the functional elements is ensured from the comparison (Yes at step ST62), the first connection verification is completed.

If mismatch between the actual connection between the functional elements and the specification is found (No at step ST62), the cause is investigated so as to appropriately correct the mismatch (step ST63).

According to the first connection verification, since the net list (third net list) 70 is provided in the form of a visualized logic circuit diagram, the connection verification can be efficiently carried out.

The comparison at step ST61 can be executed by a human system. However, when the number of the functional elements increases, the comparison may be automatically executed using a different verification tool for comparison.

Figure 7:
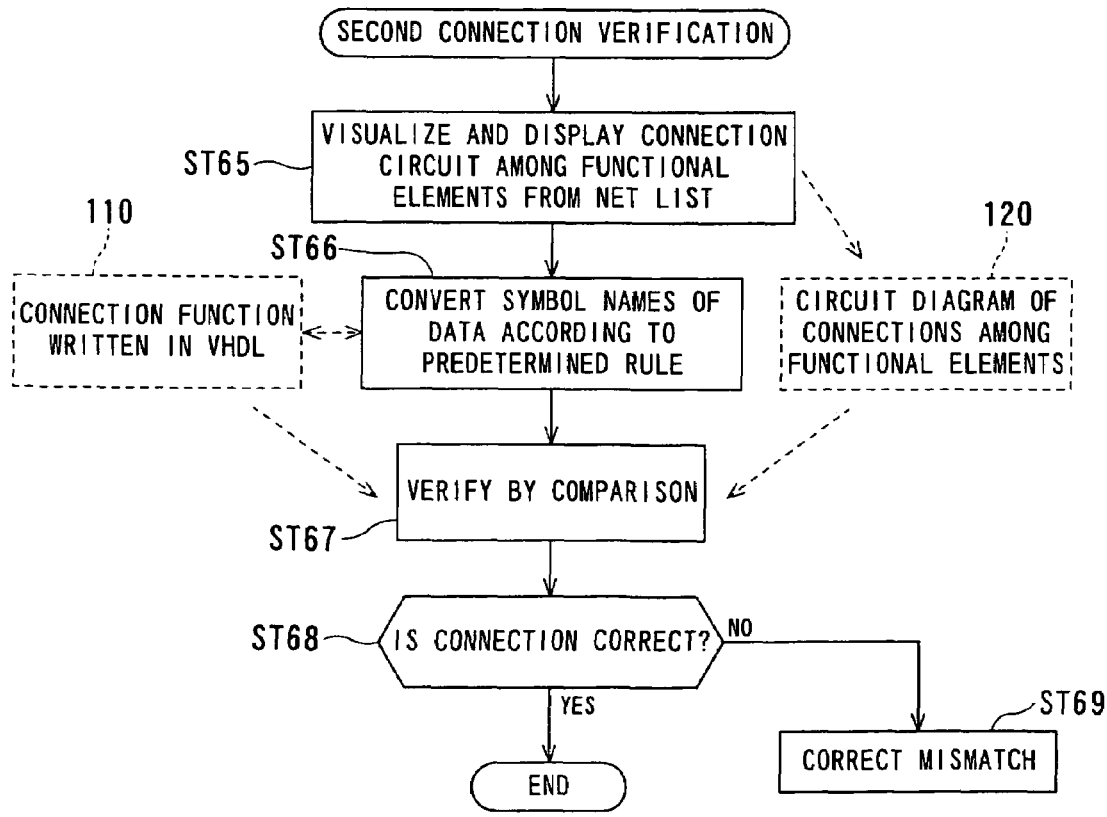
FIG. 7 illustrates an exemplary procedure of second connection verification in the verification method of a safety apparatus according to the embodiment of the present invention.

FIG. 7 illustrates the procedure of second connection verification. In the second connection verification, the connection between the functional elements in a connection function generated on the basis of the specification (i.e., connection function written in the VHDL language) is verified with respect to the connection of the functional elements in the net list (third net list) 70.

First, at step ST65, a connection circuit between the functional elements derived from the net list (third net list) 70 is visualized and displayed.

Figure 8:
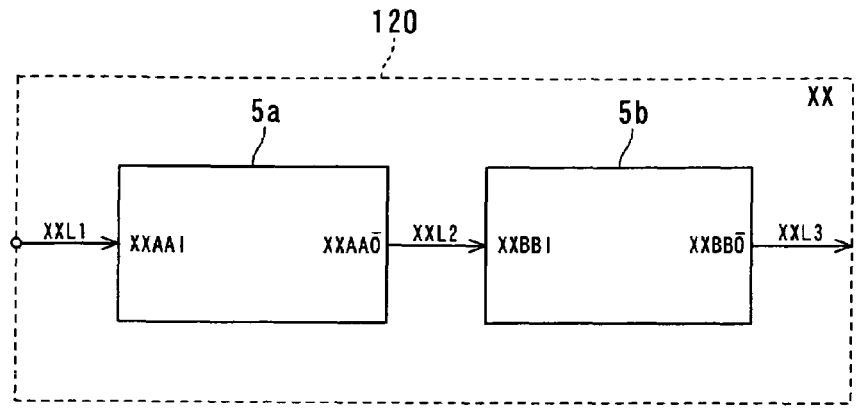
FIG. 8 is a first diagram illustrating a specific example of the procedure of the second connection verification.

FIG. 8 illustrates a visualized and displayed circuit diagram of a connection circuit 120, which is a connection circuit of a group XX including the functional elements 5a and 5b in the net list (third net list) 70. In FIG. 8, each of the functional elements 5a and 5b is regarded as a "black box". Only the connections between the functional elements are displayed.

Figure 9:
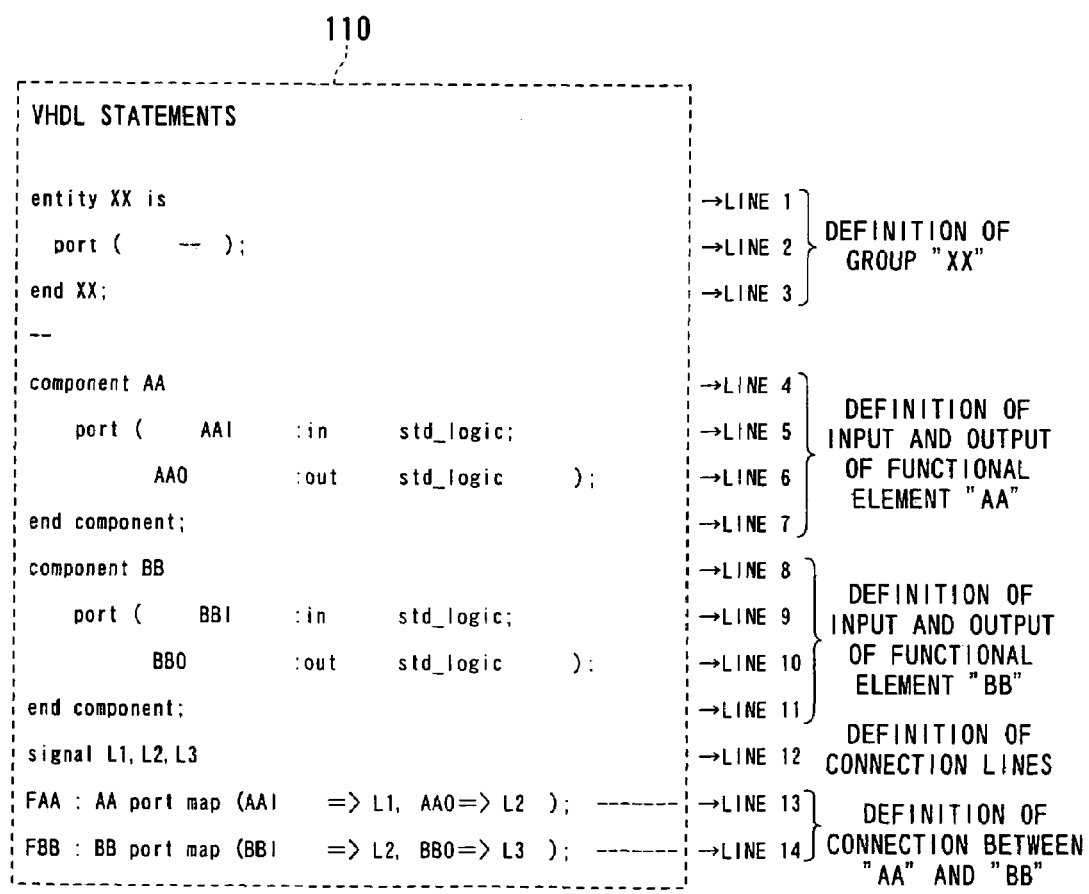
FIG. 9 is a second diagram illustrating the specific example of the procedure of the second connection verification.

FIG. 9 illustrates data 110 indicating the connection function for generating the connection circuit of the group XX. The data 110 is written in the VHDL language.

In FIG. 9, first to third lines define a group "XX". Fourth to seventh lines define the input and output of a functional element "AA" (corresponding to the functional element 5a). "AAI" represents the input of the functional element "AA" while "AAO" represents the output of the functional element "AA".

Similarly, eighth to eleventh lines define the input and output of a functional element "BB" (corresponding to the functional element 5b). "BBI" represents the input of the functional element "BB" while "BBO" represents the output of the functional element "BB".

A twelfth line defines connection lines L1, L2, and L3 between the functional elements.

Finally, thirteenth and fourteenth lines define a connection function of the whole group XX. In particular, the thirteenth line defines that the input "AAI" of the functional element "AA" is connected to the connection line L1 and the output "AAO" is connected to the connection line L2. Similarly, the fourteenth line defines that the input "BBI" of the functional element "BB" is connected to the connection line L2 and the output "BBO" is connected to the connection line L3.

By comparing the data 110 written in the VHDL language shown in FIG. 9 with the connection circuit 120 shown in FIG. 8 (step ST67 shown in FIG. 7), it is verified that the connections among the functional elements are reliably realized in the net list (third net list) 70.

It is noted that some of the signal names in the connection circuit 120 shown in FIG. 8 are changed in accordance with a predetermined rule. More specifically, the name of a signal is determined by adding a prefix "XX", which is the name of a higher level group, to the name designated in the data 110 written in the VHDL language. For example, the name "AAI" is changed to the name "XXAAI". Accordingly, a step to change the name of the data 110 written in the VHDL language (step ST669) is added prior to the comparison verification at step ST67 shown in FIG. 7.

In this embodiment, since the inside of each functional element is verified using exhaustive testing on an actual FPGA, the reliability is not impaired even though the functional element is regarded as a black box in the verification of the net list (third net list) 70. Accordingly, by sufficiently verifying only the connections among the functional elements on the net list (third net list) 70, the high reliability can be ensured.

In this embodiment, the first connection verification and the second connection verification can provide highly reliable connection verification between the functional elements.

(5) Simulation-Based Verification

Although the exhaustive testing for each functional element on an actual FPGA (step ST1 shown in FIG. 3) and the connection verification (step ST6 shown in FIG. 3) ensure the functionality and performance of a static operation, such testing is not always satisfactory for a dynamic operation caused by a slight timing shift, such as variation of a signal delay time.

Therefore, in the method for verifying the safety apparatus 1 according to this embodiment, a delay time is obtained by simulation using data of the net list (third net list) 70. By determining whether the delay time is less than or equal to a predetermined value, verification of a dynamic operation caused by a timing shift is carried out.

Figure 10:
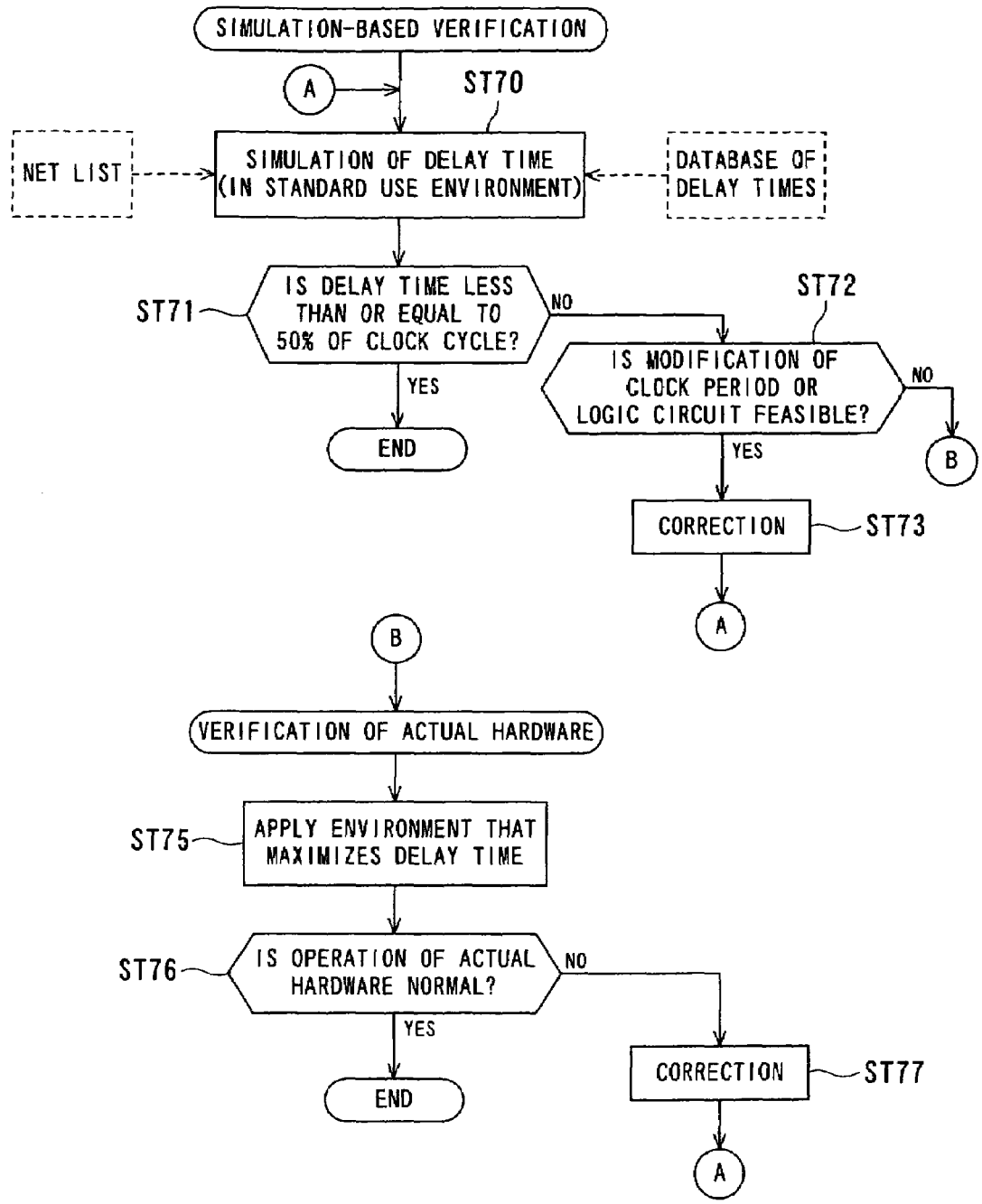
FIG. 10 illustrates an exemplary procedure of simulation-based verification in the verification method of a safety apparatus according to an embodiment of the present invention.

FIG. 10 illustrates the procedure of the simulation-based verification.

Figure 11:
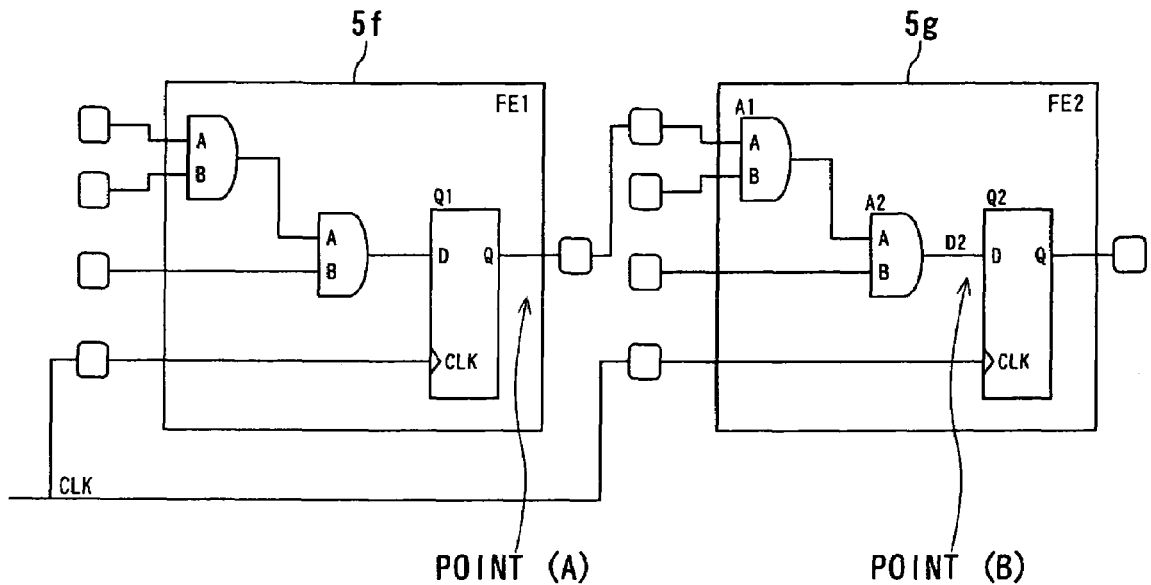
FIGS. 11A and 11B illustrate detailed diagrams of the simulation-based verification in the verification method of a safety apparatus according to an embodiment of the present invention.
Figure 11:
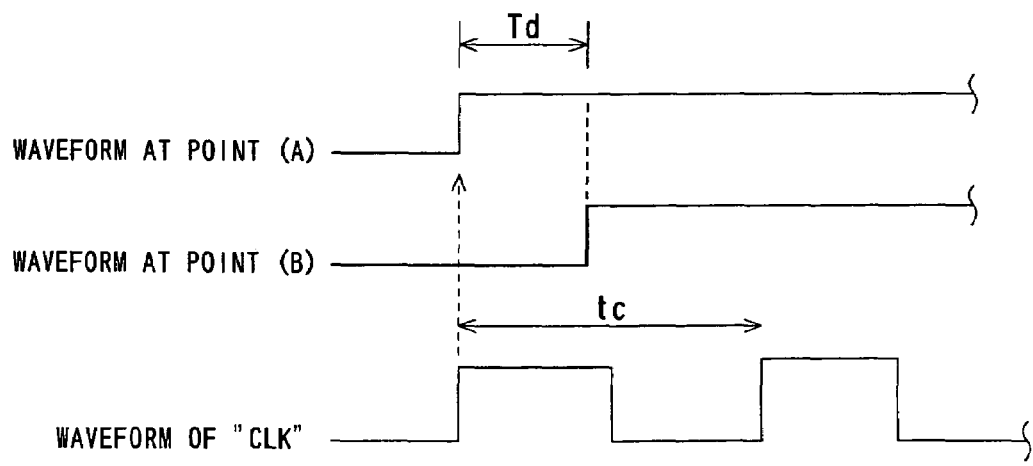

Additionally, FIG. 11A illustrates a logic circuit to describe the simulation-based verification more specifically.

First, at step ST70 shown in FIG. 10, the delay time in a predetermined portion is obtained by simulation using data of the net list (third net list) 70 and a database used for computing a delay time.

In this embodiment, as shown in FIG. 11A, the net list (third net list) 70 includes two functional elements 5ƒ and 5g. Each of the functional elements 5ƒ and 5g includes flip-flops Q1 and Q2 at its output stage. The flip-flops Q1 and Q2 operate in synchronization with an external clock signal CLK.

Here, the path that causes the delay of a signal to be maximum in the functional element 5g is a path that passes through an AND circuit A1 and an AND circuit A2 and leads to the flip-flop Q2.

To operate the functional elements 5ƒ and 5g normally, it is required that the flip-flop Q1 outputs a signal in synchronization with the external clock signal CLK and that a time Td needed for the output signal to reach the flip-flop Q2 through the AND circuits A1 and A2 is sufficiently small as compared with a clock period tc.

Accordingly, at step ST70 shown in FIG. 10, the delay time Td of the path that starts from the output of the flip-flop Q1 (point (A) shown in FIG. 11A), passes through the AND circuits A1 and A2, and leads to the input of the flip-flop Q2 (point (B) shown in FIG. 11A) is obtained by simulation.

At that time, a database that stores the delay times of the AND circuits A1 and A2 and the delay time of a connection line in the above-described path can be used as needed.

In general, the delay time of a device varies depending on an ambient temperature or a power supply voltage. The change ratio is known to be about 1.3× to 1.5× with respect to the standard use environment, namely, the state at room temperature and at the rated power supply voltage.

Accordingly, a delay time Td in a standard use environment is obtained by simulation. If the delay time Td is less than or equal to 50% of one clock period tc, an erroneous dynamic operation caused by a timing issue can be prevented even when the ambient temperature or the power supply voltage changes to an ambient temperature or a power supply voltage that causes the delay time to be maximum.

This determination is made at step ST71 shown in FIG. 10.

If the delay time Td computed by the simulation is less than or equal to 50% of the clock period tc (Yes at step ST71), this simulation-based verification is completed.

In contrast, if the delay time Td is greater than 50% of the clock period tc (No at step ST71), the design is changed. More specifically, the clock period is increased or a new flip-flop is added in the path, for example, between the AND circuits A1 and A2 so that the design is changed.

If the design change is feasible (Yes at step ST72), the net list (third net list) 70 is re-generated in accordance with the design change. Subsequently, the simulation is executed again (step ST70).

If the design change is not feasible due to, for example, another constraint (No at step ST72), the process proceeds to step ST75.

At step ST75, the operation is verified by actually imposing more stringent conditions on an actual FPGA. Even when the margin of the delay time computed by simulation under a standard environment is less than 50%, the reliability is not impaired if normal operation is guaranteed by actually imposing a condition (e.g., temperature and power supply voltage) that increases the delay time to maximum on the actual FPGA.

If, at step ST76, normal operation of the actual FPGA is guaranteed, the process is completed (Yes at step ST76). However, if normal operation of the actual FPGA cannot be guaranteed (No at step ST76), an additional countermeasure and process are required.

Additionally, in order to ensure the reliability of the simulation-based verification, it is desirable that the simulation itself is verified in advance. More specifically, an appropriate net list for evaluation is generated in advance. A delay time is determined by simulation using the net list data and a database for computing a delay time. Thereafter, a measured delay time of an actual FPGA for evaluation manufactured using the net list for evaluation is compared with the delay time determined by the simulation. Thus, the simulation itself can be verified.

(6) Verification of actual FPGA (Toggle Coverage Testing)

In the procedure of the verification method shown in FIG. 3, after the simulation-based verification is completed, data of the net list (third net list) 70 is written into an actual FPGA 4a (step ST8).

Subsequently, verification of the actual FPGA 4a is carried out (step ST9). In the verification of the actual FPGA, it is determined whether the FPGA 4a provides the functionality and performance defined by the specification. Furthermore, verification known as a toggle coverage testing is carried out to increase the reliability.

The toggle coverage testing refers to testing executed such that an index representing the level of reliability called toggle coverage becomes more than or equal to a predetermined value and, preferably, to 100% of the value.

As used herein, the term "toggle" refers to a change in a logical value of a connection line of a logic device from "0" to "1" or from "1" to "0". Also, the term "toggle coverage" refers to a ratio of the number of toggled connection lines between logic devices in the FPGA 4a to the total number of connection lines. The number of toggled connection lines is incremented by one when a predetermined logic pattern is input to the FPGA 4a while being sequentially changed and when a connection line between logic devices in the FPGA 4a is toggled.

Accordingly, "verified with toggle coverage of 100%" means that verification is completed in which all the connection lines between the logic devices in the FPGA 4a are toggled.

In the verification method according to this embodiment, exhaustive testing of the functional elements 5a to 5e is executed at step ST1 shown in FIG. 3.

Accordingly, in the toggle coverage testing at step ST9, verification of toggle coverage inside each of the functional elements is not needed. Toggle coverage testing for only the connection lines between the functional elements is sufficient. This also reduces the verification time.

Figure 12:
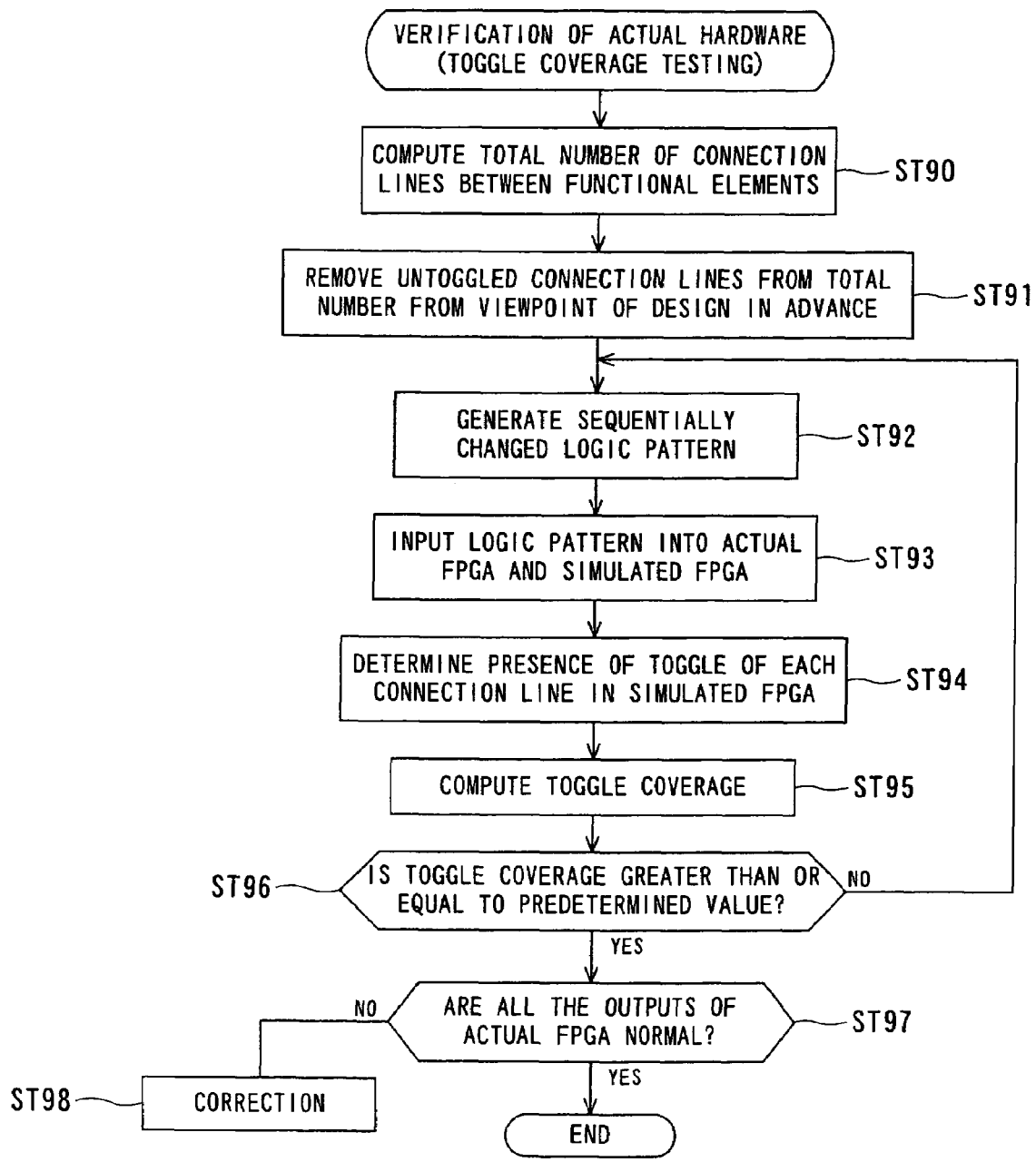
FIG. 12 illustrates an exemplary procedure of verification of the actual apparatus (toggle coverage testing) in the verification method of a safety apparatus according to an embodiment of the present invention.

FIG. 12 illustrates the procedure of verification of the actual FPGA (toggle coverage testing).

Figure 13:
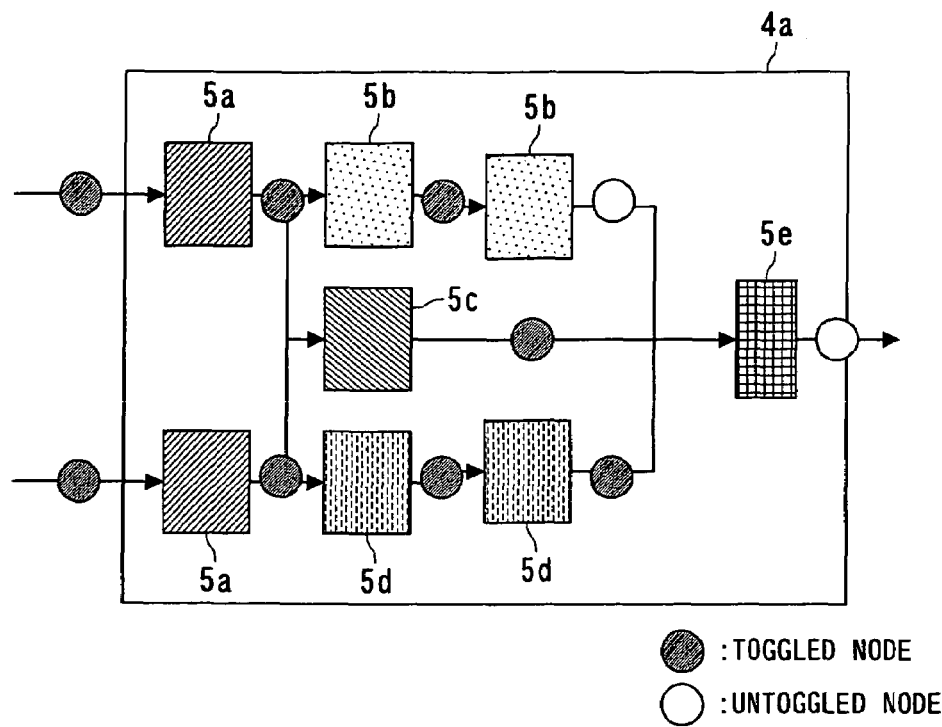
FIG. 13 is a first diagram illustrating the detailed procedure of verification of the actual apparatus (toggle coverage testing) in the verification method of a safety apparatus according to an embodiment of the present invention.

First, at step ST90, the total number of connection lines between the functional elements is computed. For example, the total number of connection lines can be computed from the connection diagram of the functional elements of the FPGA 4a shown in FIG. 13. As shown in FIG. 13, a point designated by a circle indicates a connection line (also referred to as a "node"). In the example shown in FIG. 13, the total number of nodes is 10.

In FIG. 13, a toggled node is designated by a black circle while an untoggled node is designated by a white circle. Since the total number of nodes is 10 and the number of toggled nodes is 8, the toggle coverage is 80%.

It should be noted that there is a case where some connection point between functional elements does not obviously toggle regardless of the type of a logic pattern from the viewpoint of design. For example, if a connection line is connected to a functional element including a ground line or a power supply, the logical value of the connection line will never be toggled. If the connection line that does not obviously toggle from the viewpoint of design is counted to determine the total number, the toggle coverage is meaninglessly reduced.

Therefore, at step ST91 shown in FIG. 12, a connection line that is not toggled from the viewpoint of design is removed from the total number of connection lines in advance.

Figure 14:
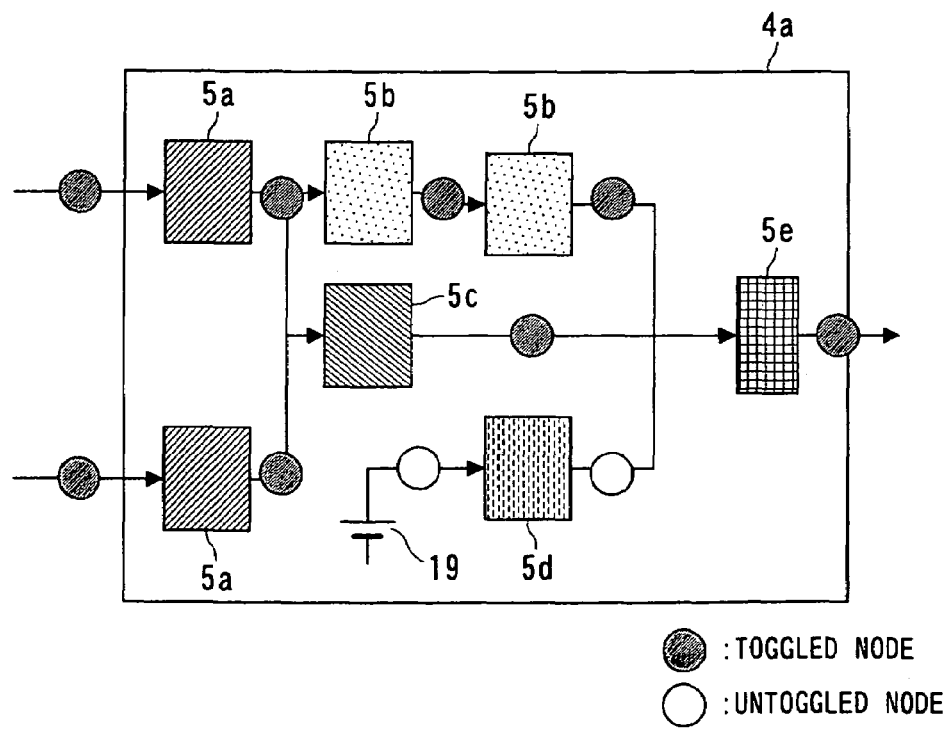
FIG. 14 is a second diagram illustrating the detailed procedure of verification of the actual apparatus (toggle coverage testing) in the verification method of a safety apparatus according to an embodiment of the present invention.

For example, in the connection diagram shown in FIG. 14, a power supply is connected to the functional element 5d, and therefore, it is apparent that the input and the output of the functional element 5d are not toggled. By removing such a connection line, the total number of connection lines used for toggle-coverage computation is 8. In the example shown in FIG. 14, the number of toggled nodes is 8. Thus, the toggle coverage is 100%.

After the total number of connection lines is computed as described above, the toggle coverage testing is started.

Figure 15:
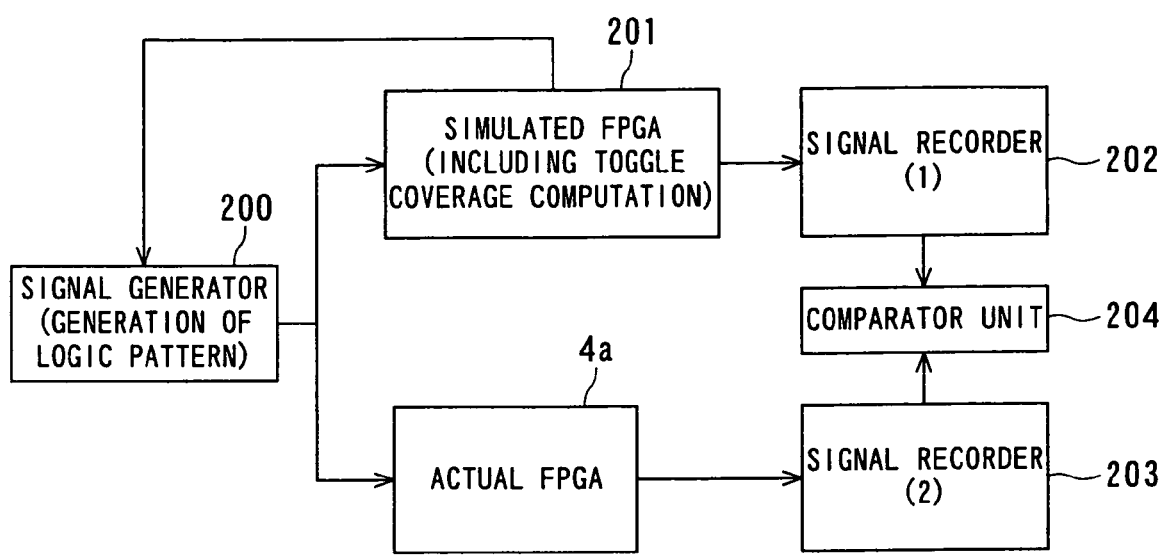
FIG. 15 illustrates a test system of the toggle coverage testing in the verification method of a safety apparatus according to an embodiment of the present invention.

FIG. 15 illustrates a test system of the toggle coverage testing. An appropriate signal generator 200 is connected between the actual FPGA 4a and a simulated FPGA 201 of the FPGA 4a. The simulated FPGA 201 can be generated from, for example, the net list (third net list) 70.

The output of the actual FPGA 4a is connected to a signal recorder (2) 203 while the output of the simulated FPGA 201 is connected to a signal recorder (1) 202. Thus, these outputs are recorded. Concurrently, it is determined whether these outputs are equal by a comparator unit 204.

In such a test system, a sequentially changed logic pattern is generated by the signal generator 200 (step ST92 shown in FIG. 12). The logic pattern is input to the actual FPGA 4a and the simulated FPGA 201 in parallel (step ST93).

In the simulated FPGA 201, it is determined whether a toggle of each connection line is present (step ST94), and the toggle coverage is automatically computed (step ST95).

Subsequently, it is determined whether the toggle coverage is greater than or equal to a predetermined value (step ST96). If it is determined that the toggle coverage is greater than or equal to the predetermined value, the testing is stopped.

Thereafter, the outputs from the actual FPGA 4a recorded, in the signal recorder (2) 203 are checked. If all the outputs are normal, the toggle coverage testing is completed.

Additionally, the simulated FPGA 201 may include a display unit that displays the circuit diagram shown in FIG. 13 and toggle states of the nodes. Furthermore, the simulated FPGA 201 may display toggled nodes separated by, for example, color as a logic pattern is sequentially changed and is input.

By monitoring the display screen of the simulated FPGA 201, a tester can easily view and check untoggled connection lines. Additionally, since the tester can check the toggle coverage in real time, the tester can terminate the testing when the toggle coverage exceeds a predetermined value. Accordingly, the tester can efficiently execute the testing. Furthermore, when the toggle coverage exceeds the predetermined value, the simulated FPGA 201 may feed back that information to the signal generator to automatically stop the generation of a logic pattern. This configuration allows automatic measurement, thus providing highly efficient testing.

Furthermore, a step may be added in which any connection line in the FPGA 4a is specified and a waveform on the specified connection line is monitored from the actual FPGA 4a and the simulated FPGA 201. This helps investigate a cause when some abnormal event occurs.

While the foregoing verification method has been described with reference to a specific FPGA 4a, the verification method according to an embodiment of the present invention is not limited to the specific FPGA. This verification method is widely applicable to a programmable logic device.

According to a verification method of the present invention and a safety apparatus verified by the verification method, after dividing an programmable logic device (FPGA) of a safety apparatus into functional elements and exhaustive testing of a logic circuit optimized for each functional element is carried out using an actual FPGA in advance. Subsequently, the verified functional elements are independently logic-synthesized. Accordingly, the equivalence with the testing of the actual FPGA is maintained. As a result, the logic circuit is optimized and the scale of the logic circuit is minimized. Thus, a verification method that ensures high reliability and a safety apparatus verified by the verification method can be provided.

Furthermore, according to a verification method of the present invention and a safety apparatus verified by the verification method, after the functional elements are synthesized, only verification of connection between the functional elements is required. As a result, the verification time can be reduced. Thus, a highly efficient verification method and a safety apparatus verified by the verification method can be provided.

Furthermore, a sufficient margin is ensured by providing a step to verify dynamic function and performance, such as a margin of a timing circuit, by simulation in advance, in addition to verifying the static functionality and performance. Therefore, high reliability can be achieved.

Still furthermore, according to a verification method of the present invention and a safety apparatus verified by the verification method, in addition to ordinary specification verification, a step to carry out toggle coverage testing on an actual hardware device is provided. Accordingly, like exhaustive testing for the inside of a functional element, the connection lines between the functional elements can be verified without overlooking an unverified connection line. As a result, high reliability can be achieved. At that time, by removing an untoggled connection line from the viewpoint of the design, the verification time can be reduced, thus providing an efficient verification.

While the invention will be described in conjunction with the preferred embodiments, it will be understood that they are not intended to limit the invention to these embodiments. On the contrary, the invention is intended to be realized by modifying its components within the spirit and scope of the invention as defined by the claims. Additionally, the invention is intended to be realized by combining appropriate components from among a plurality of components disclosed in the preferred embodiments. For example, some of the components may be removed from all the components disclosed in the preferred embodiments. Furthermore, components in a plurality of the preferred embodiments may be appropriately combined.

What is claimed is:

1. A verification method for verifying a safety apparatus including a programmable logic device, the programmable logic device including a plurality of functional elements, the method comprising the steps of:
   verifying on actual hardware that all outputs of a logic pattern are produced normally in response to all inputs of the logic pattern of each of the plurality of functional elements in advance;
   generating a plurality of functional elements, each the same as a different one of the plurality of functional elements verified on the actual hardware, using a predetermined hardware description language;
   independently logic-synthesizing each of the generated functional elements into a plurality of first net lists;
   generating a connection function among the generated functional elements using the predetermined hardware description language;
   logic-synthesizing the generated connection function into a second net list corresponding to the connection function;
   synthesizing the plurality of first net lists with the second net list to generate a third net list;
   writing a logic circuit into the programmable logic device on the basis of the third net list; and
   verifying on the programmable logic device including the written logic circuit that the operation of the programmable logic device is normal.

2. The verification method according to claim 1, further comprising the step of:
   verifying connections among the functional elements on the basis of the generated third net list.

3. The verification method according to claim 2, wherein the step of verifying connections among the functional elements includes the sub-step of:
   visualizing and displaying a logic circuit realizing the functional elements and the connection function on the basis of data of the generated third net list so as to verify that connections among the functional elements are correct on the basis of the displayed logic circuit and a specification defining the connection function.

4. The verification method according to claim 2, wherein the step of verifying connections among the functional elements includes the sub-step of:
   visualizing and displaying a connection circuit realizing the connection function so as to verify that connections among the functional elements are correct on the basis of the displayed connection circuit and a connection function represented by the predetermined hardware description language.

5. The verification method according to claim 1, further comprising the step of:
   simulating the operation of the programmable logic device on the basis of data of the generated third net list so as to verify that the operation of the programmable logic device is normal;
   wherein the step of simulating the operation of the programmable logic device includes a sub-step of evaluating a delay time of a logic circuit disposed between flip-flop devices operating in synchronization with the same clock by simulation so as to verify that the evaluated delay time is less than or equal to 50% of the period of the clock in a standard use environment.

6. The verification method according to claim 5, wherein the simulation of the delay time in the step of simulating the operation of the programmable logic device includes a simulation whose effectiveness is verified in advance using an appropriate net list for evaluation and a programmable logic device written on the basis of the net list for evaluation.

7. The verification method according to claim 1, wherein the step of verifying on actual hardware includes the sub-steps of:
   evaluating a delay time of a logic circuit disposed between flip-flop devices operating in synchronization with the same clock by simulation; and
   if the evaluated delay time is greater than 50% of the period of the clock in a standard use environment, verifying the programmable logic device on actual hardware while applying a use environment causing the delay time to be maximum to the programmable logic device so as to verify that the operation of the programmable logic device is normal.

8. The verification method according to claim 1, wherein the step of verifying on actual hardware includes toggle coverage testing, the toggle coverage testing including the sub-steps of:
   computing the total number of connection lines among the functional elements in advance;
   inputting a predetermined logic pattern into the programmable logic device while sequentially changing the logic pattern;
   computing the number of connection lines whose logical value is changed in accordance with the change in the input logic pattern;
   computing toggle coverage that is a ratio of the number of connection lines whose logical value is changed to the total number of connection lines; and
   verifying that the toggle coverage is greater than or equal to a predetermined value.

9. The verification method according to claim 8, wherein the toggle coverage testing includes testing for computing the total number of connection lines while removing a connection line connected to ground and a connection line connected to a power supply from the total number of connection lines.

10. The verification method according to claim 8, wherein the toggle coverage testing includes testing for computing the total number of connection lines while removing a connection line whose output logical value is apparently a fixed value regardless of an input logical value from the viewpoint of design.

11. The verification method according to claim 8, wherein the toggle coverage testing includes the sub-steps of:
sequentially inputting the logic pattern into the actual programmable logic device and a simulated programmable logic device that simulates the actual programmable logic device in parallel so as to monitor that the output of the actual programmable logic device is normal;
monitoring the change in a logical value of a connection line inside the simulated programmable logic device so as to compute the number of connection lines whose logical value is changed;
sequentially computing the toggle coverage in response to the input of the logic pattern; and
terminating the testing when the toggle coverage is greater than or equal to a predetermined value.

12. The verification method according to claim 11, wherein the toggle coverage testing includes the sub-step of selecting any connection line and monitoring waveforms on the selected connection line in the actual programmable logic device and the simulated programmable logic device.

13. A safety apparatus comprising a programmable logic device including a plurality of functional elements, wherein the safety apparatus is verified by a verification method including the steps of:
verifying on actual hardware that all outputs of he a logic pattern are produced normally in response to all inputs of the logic pattern of each functional element in advance;
generating a plurality of functional elements, each the same as a different one of the functional elements verified on actual hardware using a predetermined hardware description language;
independently logic-synthesizing each of the generated functional elements into a plurality of first net lists;
generating a connection function between the generated functional elements using the predetermined hardware description language;
logic-synthesizing the generated connection function into a second net list corresponding to the connection function;
synthesizing the plurality of first net lists with the second net list to generate a third net list;
writing a logic circuit into the programmable logic device on the basis of the third net list; and
verifying on the actual programmable logic device including the written logic circuit that the operation of the programmable logic device is normal.

14. The safety apparatus according to claim 13, wherein the verification method further includes the step of verifying connections among the functional elements on the basis of the generated third net list.

15. The safety apparatus according to claim 14, wherein the step of verifying a connection between the functional elements includes the sub-step of:
visualizing and displaying a logic circuit realizing the functional elements and the connection function on the basis of data of the generated third net list so as to verify that connections among the functional elements are correct on the basis of the displayed logic circuit and a specification defining the connection function.

16. The safety apparatus according to claim 14, wherein the step of verifying connections among the functional elements includes the sub-step of:
visualizing and displaying a connection circuit realizing the connection function so as to verify that connections between the functional elements are correct on the basis of the displayed connection circuit and a connection function realized by the predetermined hardware description language.

17. The safety apparatus according to claim 13, wherein the verification method further includes the step of simulating the operation of the programmable logic device on the basis of data of the generated third net list so as to verify that the operation of the programmable logic device is normal, and wherein the step of simulating the operation of the programmable logic device includes a sub-step of evaluating a delay time of a logic circuit disposed between flip-flop devices operating in synchronization with the same clock by simulation so as to verify that the evaluated delay time is less than or equal to 50% of the period of the clock in a standard use environment.

18. The safety apparatus according to claim 17, wherein the simulation of the delay time in the step of simulating the operation of the programmable logic device includes a simulation whose effectiveness is verified in advance using an appropriate net list for evaluation and a programmable logic device written on the basis of the net list for evaluation.

19. The safety apparatus according to claim 13, wherein the step of verifying on actual hardware includes the sub-steps of:
evaluating a delay time of a logic circuit disposed between flip-flop devices operating in synchronization with the same clock by simulation; and
if the evaluated delay time is greater than 50% of the period of the clock in a standard use environment, verifying the programmable logic device on actual hardware while applying a use environment causing the delay time to be maximum to the programmable logic device so as to verify that the operation of the programmable logic device is normal.

20. The safety apparatus according to claim 13, wherein the step of verifying on actual hardware includes toggle coverage testing, the toggle coverage testing including the sub-steps of:
computing the total number of connection lines among the functional elements in advance;
inputting a predetermined logic pattern into the programmable logic device while sequentially changing the logic pattern;
computing the number of connection lines whose logical value is changed in accordance with the change in the logic pattern;
computing toggle coverage that is a ratio of the number of connection lines whose logical value is changed to the total number of connection lines; and
verifying that the toggle coverage is greater than or equal to a predetermined value.

21. The safety apparatus according to claim 20, wherein the toggle coverage testing includes testing for computing the total number of connection lines while removing a connection line connected to ground and a connection line connected to a power supply from the total number of connection lines.

22. The safety apparatus according to claim 20, wherein the toggle coverage testing includes testing for computing the total number of connection lines while removing a connection line whose output logical value is apparently a fixed value regardless of an input logical value from the viewpoint of design.

23. The safety apparatus according to claim 20, wherein the toggle coverage testing includes the sub-steps of:
sequentially inputting the logic pattern into the actual programmable logic device and a simulated programmable logic device that simulates the actual programmable logic device in parallel so as to monitor that the output of the actual programmable logic device is normal;

monitoring the change in a logical value of a connection line inside the simulated programmable logic device so as to compute the number of connection lines whose logical value is changed;

sequentially computing the toggle coverage in response to the input of the logic pattern; and terminating the testing when the toggle coverage is greater than or equal to a predetermined value.

24. The safety apparatus according to claim 23, wherein the toggle coverage testing includes the sub-step of selecting any connection line and monitoring waveforms on the selected connection line in the actual programmable logic device and the simulated programmable logic device.

* * * * *